United States Patent [19]
Ciccone

[11] Patent Number: 5,917,255
[45] Date of Patent: Jun. 29, 1999

[54] POWER-ON-RESET CIRCUIT HAVING REDUCED SIZE CHARGING CAPACITOR

[75] Inventor: John C. Ciccone, Scottsdale, Ariz.

[73] Assignee: VLSI Technology, Inc., San Jose, Calif.

[21] Appl. No.: 09/009,761

[22] Filed: Jan. 20, 1998

[51] Int. Cl.$^6$ ................................................. H03K 17/22
[52] U.S. Cl. ........................ 307/130; 327/142; 327/143; 327/198
[58] Field of Search ................................ 307/125, 130; 327/143, 192, 142, 198

[56] References Cited

U.S. PATENT DOCUMENTS

| | | | |
|---|---|---|---|
| 4,045,688 | 8/1977 | Stewart | 327/437 |
| 4,717,840 | 1/1988 | Ouyang et al. | 327/143 |
| 5,483,187 | 1/1996 | Jang | 327/143 |
| 5,517,144 | 5/1996 | Nakashima | 327/198 |

*Primary Examiner*—Albert W. Paladini
*Attorney, Agent, or Firm*—Burns, Doane, Swecker & Mathis LLP

[57] ABSTRACT

A power-on-reset (POR) circuit having a reduced sized charging capacitor is described which includes a voltage detection portion, a delay portion, and a POR signal generation portion. The voltage level detection portion functions to provide a level indicator signal after the power supply has reached a predetermined voltage level. The delay portion in response to the level indicator signal indicating that the power supply is greater than or equal to the predetermined voltage level charges a chargeable node to an inverter trip point voltage level in a predetermined delay time interval dependent on a capacitive element and a diode connected MOS device both connected to the chargeable node. The POR signal generation portion, in response to the voltage trip point level on the chargeable node, outputs a POR signal an extended time interval afterwards. The diode connected MOS device coupled to the chargeable node adds capacitance to the node and diminishes charging current as the node charges thereby allowing for the reduction in size of the capacitive element and a substantial reduction in size of the overall POR circuit layout size.

10 Claims, 5 Drawing Sheets

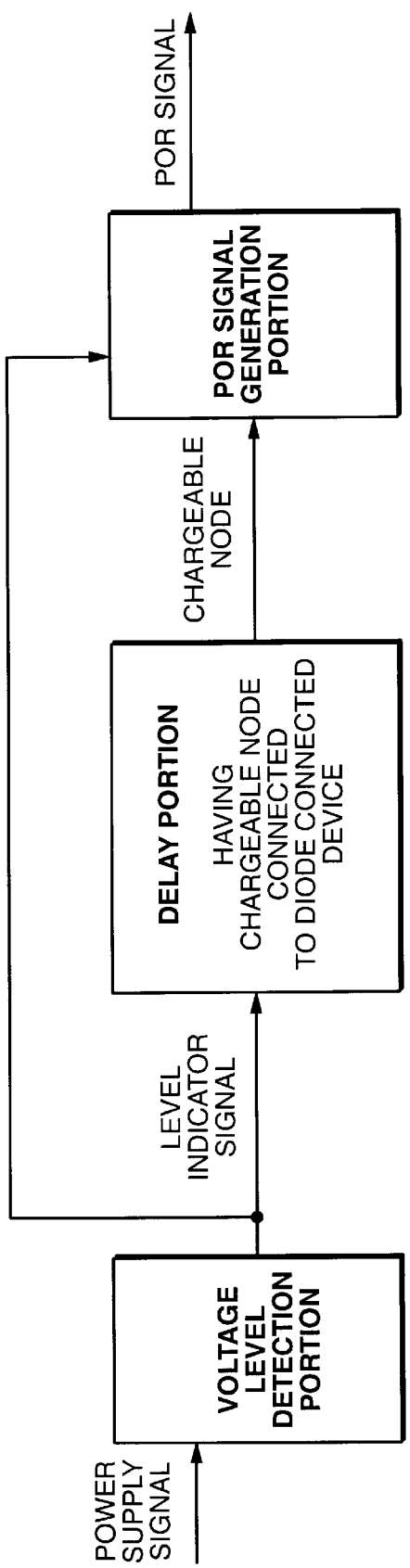
FIG._1

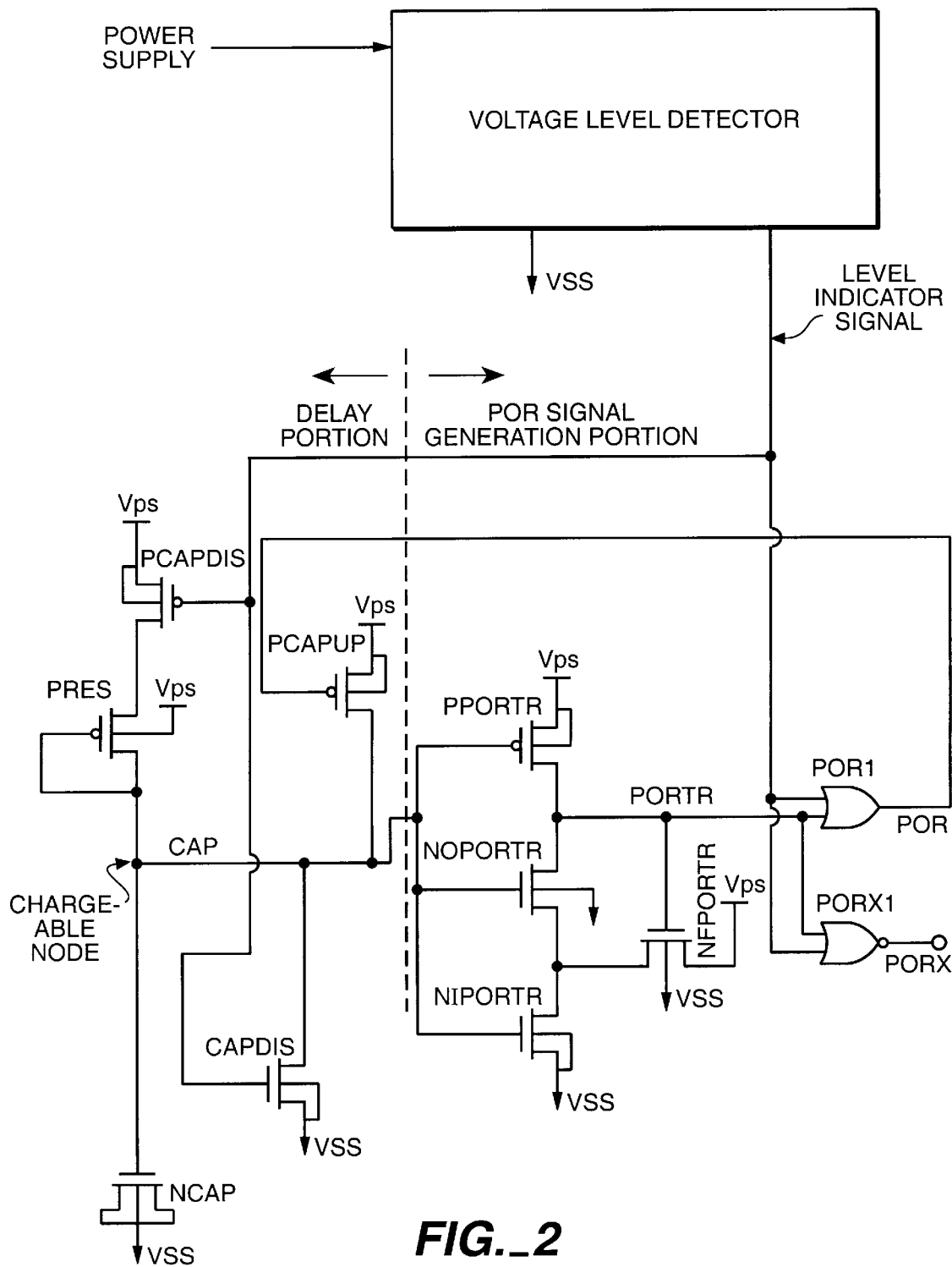
FIG._2

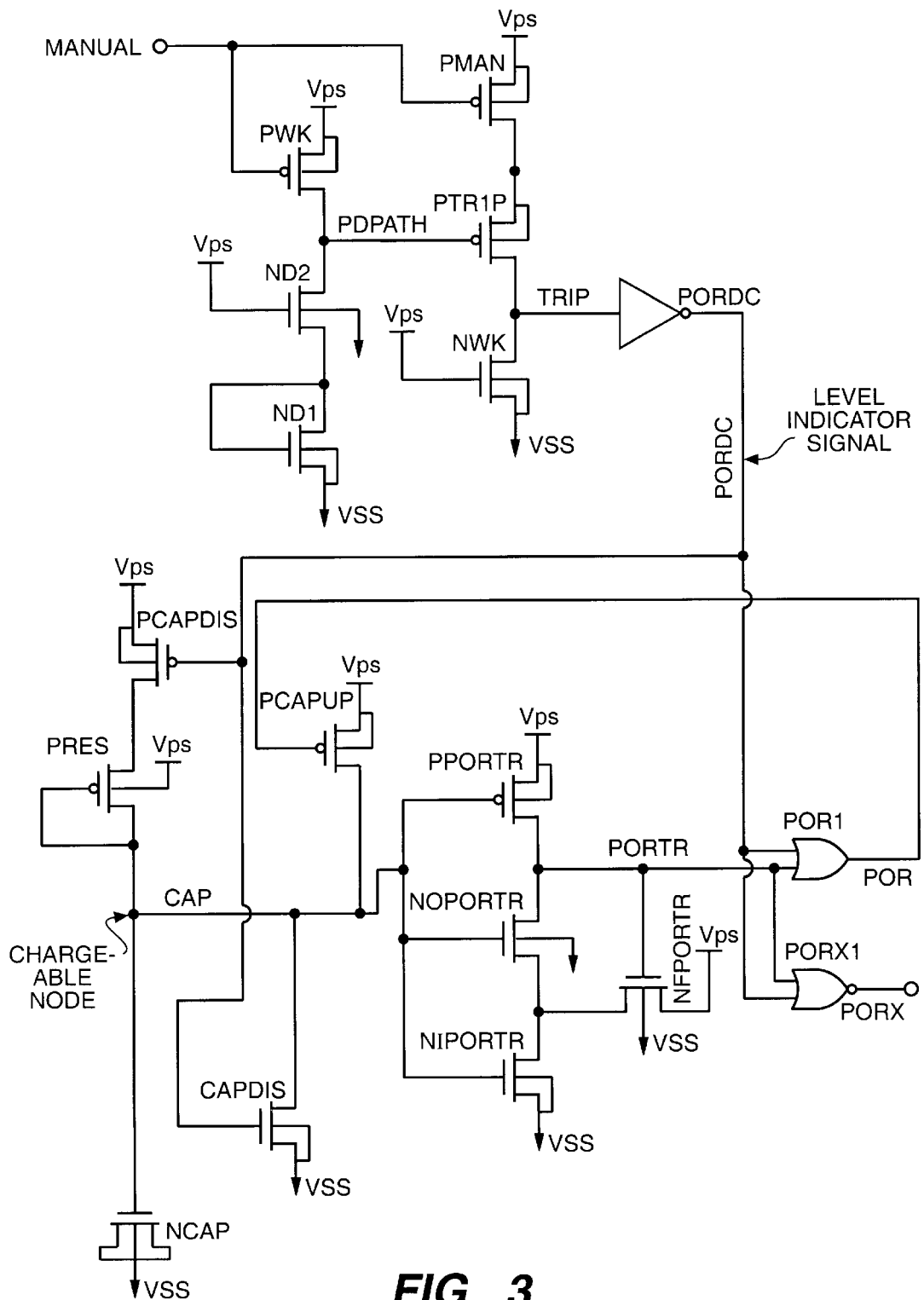
FIG._3

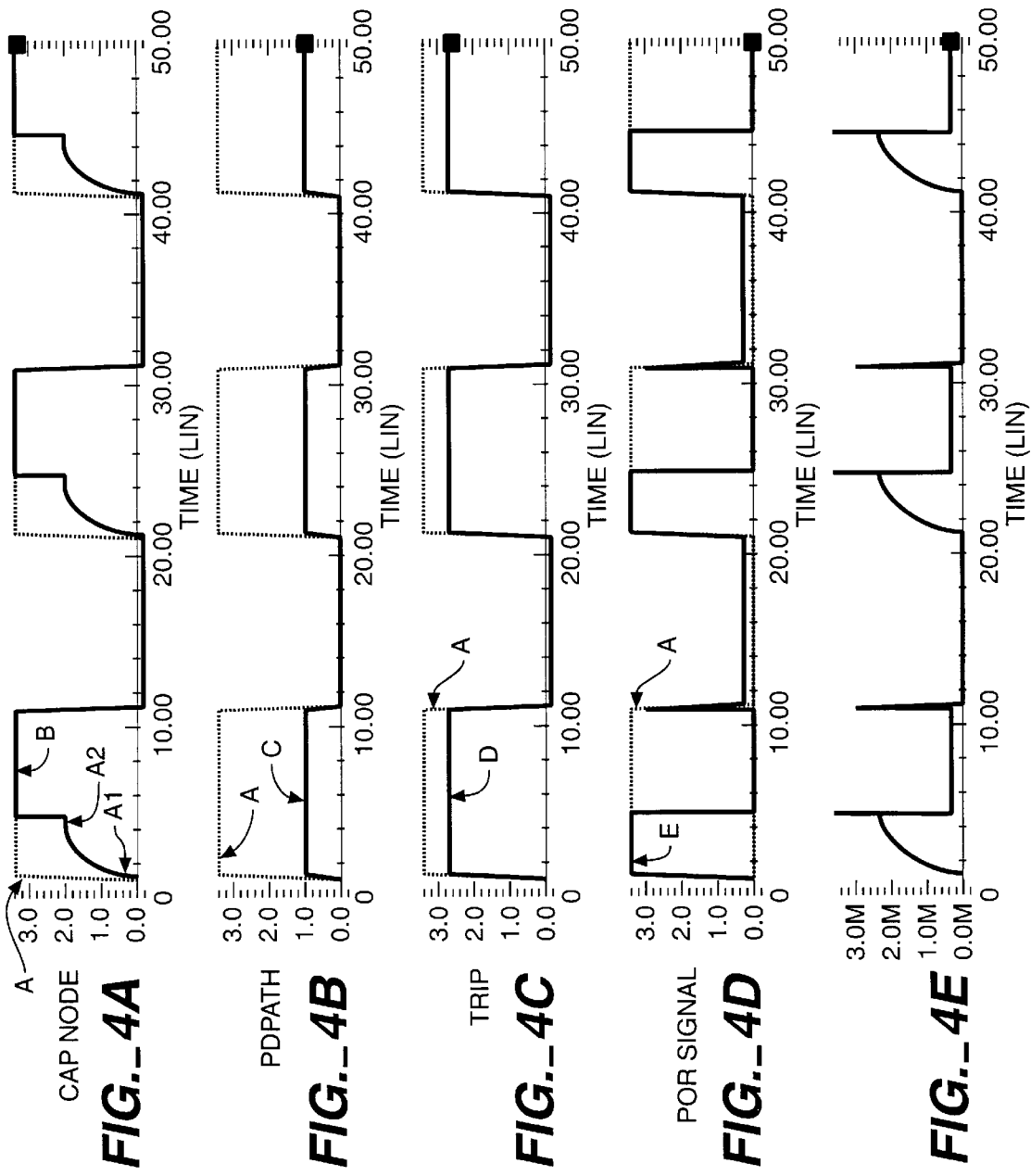

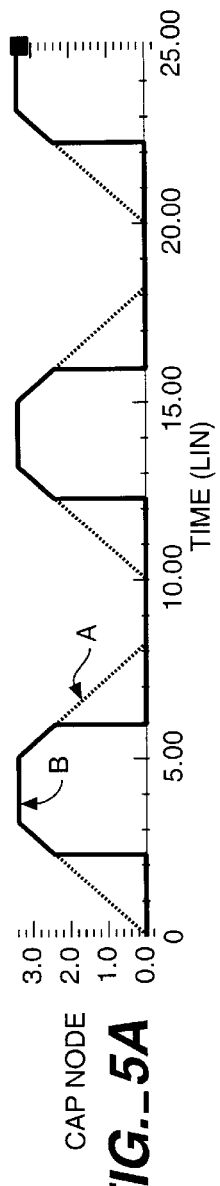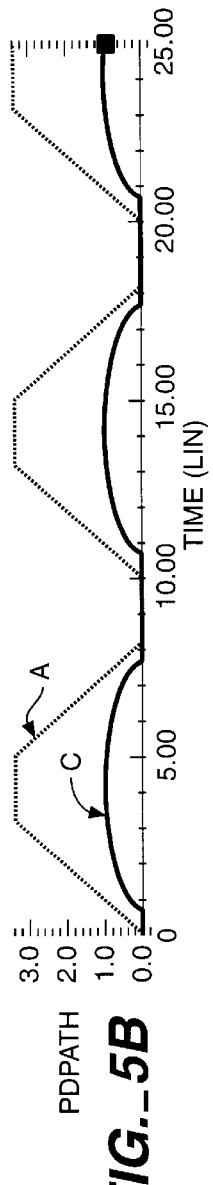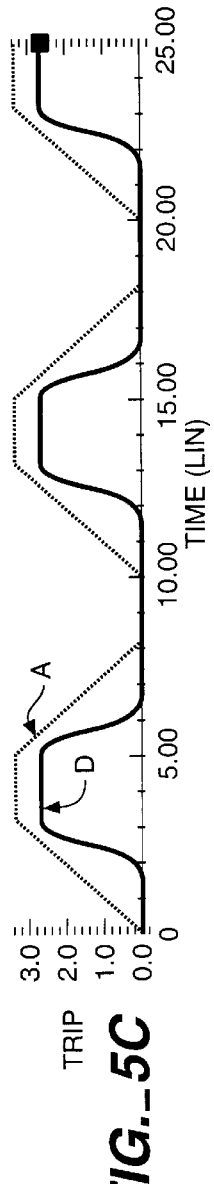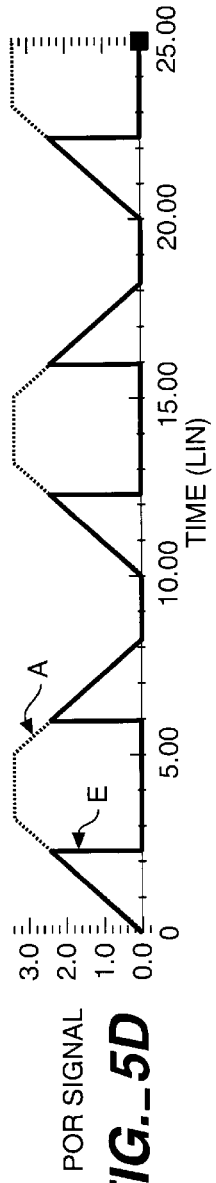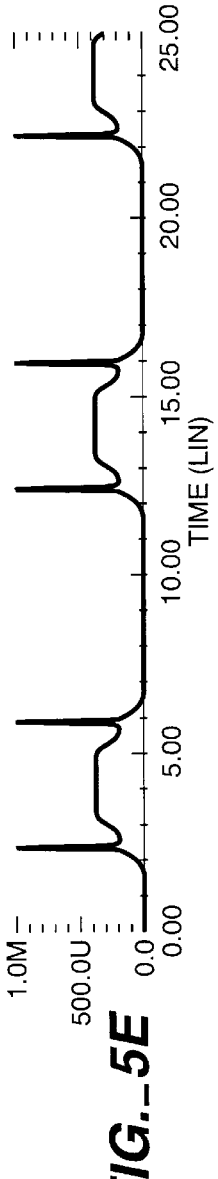

POWER-ON-RESET CIRCUIT HAVING REDUCED SIZE CHARGING CAPACITOR

BACKGROUND OF THE INVENTION

FIELD OF THE INVENTION

The present invention relates to power-on-reset (POR) circuits, and more particularly to POR circuits in integrated circuit devices.

STATE OF THE ART

POR circuits are often used when powering up digital ICs. The POR provides a delayed reset signal to portions of the IC to set logic within the circuit to a known state upon start-up. Specifically, when powering up an integrated circuit, the power supply voltage is often ramped up to the intended full level of the power supply voltage instead of directly applying full power. During this time, the integrated circuit is in an intermediate state and any reset signal generated while the circuit is being powered up may appear to be at a digital level other than the intended reset digital level. Consequently, the reset signal is generally provided to the remainder of the integrated circuit a short delay time after the power supply voltage has been applied to the power supply ports and has reached a minimum level voltage.

The POR circuit often includes a voltage level detector portion for detecting when the power supply voltage has reached a predetermined minimum voltage level as its being ramped to full power and a delay portion for extending the application of the reset signal for a given amount of time after the power supply has reached the predetermined voltage level. Currently, the delay portion of the POR circuit is implemented as a RC circuit made up of resistive and capacitive elements. To obtain the desired delay time in the prior art POR circuit, a large capacitive element is designed into the POR integrated circuit layout resulting in an overall increase in the size of the POR circuit.

In general, the voltage level detector portion of the POR circuit includes a differential input device that functions to compare the power supply signal to a supply independent reference voltage which is less than the power supply voltage. One of the main disadvantages of this type of voltage level detector is that it is sensitive to the rate at which the power supply is ramped and this dependency can result in erroneous level detection results.

The present invention is an improved POR circuit design which minimizes the size of the capacitor used in the delay portion of the POR circuit so as to reduce the overall size of the POR integrated circuit layout. In addition, the improved POR circuit obviates the need for generating a reference voltage in the level detection circuit.

SUMMARY OF THE INVENTION

The present invention, in general, is a power-on-reset (POR) circuit having a reduced sized charging capacitor. The POR circuit includes a voltage detection portion, a delay portion including a chargeable node coupled to a capacitive element and a diode connected MOS device, and a POR signal generation portion. The voltage level detection portion functions to provide a level indicator signal indicating whether the power supply has reached a predetermined voltage level, the delay portion provides a predetermined delay having a time interval dependent on the time it takes to charge the chargeable node in response to the level indicator signal indicating that the power supply is greater than or equal to the predetermined voltage level, and the POR signal generation portion in response to the voltage level on the chargeable node, outputs a reset signal for a predetermined delay time interval after the power supply has reached the predetermined voltage level.

The delay portion includes a chargeable node having a capacitive element and a diode connected MOS device connected to it. When the level indication signal indicates that the power supply has reached the predetermined voltage level, the delay portion is enabled and begins charging the chargeable node at a rate determined by the capacitive element and the diode connected MOS device. The diode connected MOS device allows for the reduction in size of the capacitive element by adding capacitance to the chargeable node and by diminishing the charging current as the node voltage increases.

The POR signal generation portion includes logic which, in response to the voltage level of the chargeable node and the level indicator signal, provides a reset signal. The POR signal generation portion further provides a feedback signal to the delay portion which causes the chargeable node to be pulled to the current maximum power supply level to improve noise immunity.

In a preferred embodiment of the POR circuit, the voltage level detection portion includes first and second stages of device stacks each coupled to the power supply signal and a power-down mode control signal. In the case when the POR circuit is in a power-down mode, the voltage level detection portion outputs a level indication signal which causes the reset signal to be asserted no matter what the power supply voltage level is at. In the case when the POR circuit is in power-up mode, the voltage level indication portion is activated such that when the power supply reaches the predetermined voltage level (dependent on threshold voltages of the first and second stage device stacks) the voltage level detection portion outputs a level indicator signal indicating that the predetermined voltage level has been reached.

BRIEF DESCRIPTION OF THE DRAWINGS

The present invention may be further understood from the following written description in conjunction with the appended drawings. In the drawings:

FIG. 1 shows a block diagram of a POR circuit including a voltage level detection portion, a delay portion having a chargeable node coupled to a diode connected MOS device and a capacitive element, and a POR signal generation portion;

FIG. 2 shows a POR circuit which includes a voltage level detection portion and a preferred circuit embodiment of the delay portion and the POR signal generation portion;

FIG. 3 shows the POR circuit shown in FIG. 2 including a preferred embodiment of a voltage level detection portion;

FIGS. 4A–4E show timing diagrams of signals in the circuit embodiment shown in FIG. 3 in which the power supply signal is quickly ramped to VDD.

FIGS. 5A–5E show timing diagrams of signals in the circuit embodiment shown in FIG. 3 in which the power supply signal is slowly ramped to VDD.

DETAILED DESCRIPTION OF THE PREFERRED EMBODIMENTS

The present invention, in general, is an improved POR circuit design that allows for the reduction in size of the charging capacitor which typically determines the amount of delay occurring prior to the application of the POR signal in prior art POR circuits.

FIG. 1 shows a block diagram of a power-on-reset circuit in accordance with the present invention including a voltage level detection portion for providing a level indicator signal indicating when the power supply signal is greater than or equal to a predetermined voltage level, a delay portion for providing a predetermined delay time interval, and a POR signal generation portion for outputting a reset signal for a predetermined delay time in response to the level indicator signal.

The voltage level detection portion, in response to the power supply signal indicates to the delay portion via the level indication signal when the power supply has reached a predetermined power supply level. When the level indicator signal is in a first state indicating that the power supply is less than the predetermined voltage level, the level indicator signal causes the chargeable node to be discharged to the VSS voltage level (e.g., ground). When the level indicator signal is in a second state indicating that the power supply signal is equal to or greater than the predetermined voltage level, the level indicator signal causes the chargeable node to begin to charge at a rate determined by a capacitive element and a diode connected MOS device. The amount of time it takes to charge the node corresponds to a predetermined delay time that the reset signal is asserted after the power supply has reached the predetermined voltage level. The diode connected device provides two notable features to the POR circuit in that it adds capacitance to the chargeable node and also diminishes charging current as the node charges thereby allowing for the reduction in size of the capacitive element. Since, the capacitive element in a typical POR circuit tends to represent a large percentage of the POR circuit layout area, reducing this capacitor represents a significant reduction in overall size of the POR circuit. In particular, in one embodiment of the POR circuit the charging capacitor can be reduced to half of its size when used in a POR circuit including a diode connected MOS device coupled to the charging node.

The chargeable node is coupled to the POR signal generation portion along with the level indicator signal. When the chargeable node is charged to the current power supply voltage level after the predetermined delay time and when the level indicator signal indicates that the power supply has reached the predetermined voltage level, the POR signal generation portion outputs a signal which resets the integrated circuit.

FIG. 2 shows an embodiment of the POR circuit including preferred circuit embodiments of the delay portion and the POR signal generation portion. The delay portion includes PMOS device PCAPDIS and NMOS device CAPDIS which essentially control whether the CAP node is charged or discharged. Specifically, when the level indicator signal is LOW, device PCAPDIS is on and device CAPDIS is off such that the CAP node is charged to Vps by devices PCAPDIS and PRES. When the level indicator signal is HIGH, device PCAPDIS is off and device CAPDIS is on such that the CAP node is discharged by device CAPDIS to VSS.

When the level indicator signal transitions HIGH-to-LOW, devices PCAPDIS and diode connected PMOS device PRES turn on. This causes NMOS device NCAP (and consequently, the CAP node) to begin to charge. Node CAP charges at a rate predominantly determined by the size of device NCAP and by the capacitance contributed by the gate capacitance of device PRES. The device PRES functions such that as node CAP charges up, its drain-to-source and gate-to-source voltages reduce, causing the charging current to diminish rapidly. In the case when the level indicator signal is HIGH, device CAPDIS discharges node CAP to VSS.

The CAP node is coupled to the POR signal generation portion and in particular is coupled to the input of an inverter. In the preferred embodiment shown in FIG. 2 the inverter is embodied as a Schmidt trigger inverter including PMOS device PPORTR, and NMOS devices NOPORTR, NIPORTR, and NFPORTR and having an output PORTR. In the case in which the CAP node is LOW, (i.e., when the node is discharged), the output of the inverter PORTR is HIGH and when the CAP node is charged so as to exceed the trip voltage of the inverter (i.e., the predetermined voltage level), the output signal PORTR transitions HIGH-to-LOW.

Each of the level indicator signal and the PORTR signal is coupled to one input of OR gate POR1 and NOR gate PORX1. A HIGH PORTR signal indicates that the CAP node is discharged to ground or has not reached the trip point of the inverter and hence the PORX signal keeps the circuit in a reset state (i.e., PORX=LOW). In particular, when the PORTR signal is HIGH, NOR gate PORX1 outputs a LOW PORX signal no matter what state the level indicator signal is in.

A LOW PORTR signal indicates that the CAP node is at or above the inverter trip point and when the level indicator signal is also LOW, NOR gate PORX1 outputs a HIGH PORX signal.

The embodiment of the POR circuit shown in FIG. 2 also includes a feedback loop including OR gate POR1 and PMOS device PCAPUP. When the CAP node is below the inverter trip point voltage, the output signal PORTR is HIGH and the output of logic gate POR1 is HIGH such that device PCAPUP is off and has no effect on the CAP node. However, when the CAP node exceeds the trip point of the inverter, the PORTR signal is LOW. In addition, in order for the PORTR signal to be LOW, the level indicator signal must also be LOW, since the CAP node only is charged when the level indicator signal is LOW. Consequently, with both inputs of logic gate POR1 are LOW, the gate of device PCAPUP is driven LOW causing it to conduct such that it pulls the CAP node to the current voltage level of Vps. This feedback loop ensures that intermittent noise injected into the circuit will not cause the state of the Schmidt trigger to flip.

FIG. 3 shows a preferred embodiment of a POR circuit as shown in FIG. 2 including a preferred embodiment of the voltage level detection portion having a power-down mode. As can be seen, the voltage level detection portion includes first and second stages of series connected MOS device stacks coupled between the power supply signal Vps and a reference potential VSS. In the case in which the circuit is in power-up mode (i.e., when MANUAL is LOW) and the power supply voltage is below the two MOS threshold voltages required to turn-on devices ND1 and ND2, both of the first and second stages are disabled. In addition, since device PMAN is on and device PTRIP is off, the TRIP voltage signal is LOW and the level indicator signal is HIGH.

As the power supply voltage level increases and reaches a voltage level corresponding to the turn-on threshold voltages of ND1 and ND2, the first stage is enabled and signal PDPATH is pulled low so as to turn device PTRIP on. As Vps increases further the TRIP signal increases until it exceeds the trip point voltage of the PORDC inverter (i.e., logical HIGH voltage). In response, the PORDC inverter outputs a LOW level indicator signal causing the delay portion to be enabled.

In the case of a power down mode, signal MANUAL is HIGH, devices PWK and PMAN are off such that both the first and second stages are disabled. Consequently, the TRIP signal is LOW and the level indicator signal is HIGH. In this case, a PORX=LOW is asserted and the integrated circuit is kept in a reset state.

The level indicator signal is coupled to device PCAPDIS, CAPDIS of the node charging stage (i.e., devices PCAPDIS, CAPDIS, and NCAP) and its state determines whether the node CAP is charged (level indicator signal=LOW) or discharged (level indicator signal=HIGH).

The level indicator signal is also coupled to logic gates POR1 and PORX1 of the POR signal logic stage and its state determines whether the PORX signal keeps the circuit in a reset state (i.e., level indicator signal=HIGH and PROX=LOW) or the PORX signal resets the circuit (i.e. level indicator signal=LOW and PORTR signal=LOW and PORX=HIGH) in a delay time determined by the node charging stage.

Also shown is the feedback loop that pulls the CAP node to the current power supply level, once the PORTR signal line transitions LOW to ensure that the Schmidth trigger does not change states after the PORX signal goes HIGH and the integrated circuit is reset.

In one embodiment of the present invention the gates of PRES and NCAP device may be fabricated from a single piece of poly also increasing the charge on the CAP node and reducing circuit size.

FIGS. 4A–4E show timing diagrams of signals in the circuit embodiment shown in FIG. 3 in which the power supply signal Vps is quickly ramped to VDD=3.00 volts. FIG. 4A shows the power supply signal (A) superimposed on the CAP node voltage signal (B). FIG. 4B shows the power supply signal (A) superimposed on the PDPATH voltage signal (C). FIG. 4C shows the power supply signal (A) superimposed on the TRIP signal (D). FIG. 4D shows the power supply signal (A) superimposed on the POR voltage signal (E). FIG. 4E shows a power dissipation curve of the circuit.

FIG. 4A shows the power supply voltage being ramped up to VDD=3.00 volts in less than 1 micro ($\mu$) second. When this occurs, ND2 and ND1 turn-on, causing PDPATH to transition to a voltage corresponding to approximately two threshold voltages ($\approx$1.00 volt) above the reference potential as shown by the PDPATH voltage signal (C) in FIG. 4B. With PDPATH at two threshold voltages above the reference potential, device PTRIP turns-on causing the voltage on the TRIP signal (D) (FIG. 4C) to be pulled to a voltage approximately equal to 3.00.

Pulling the voltage signal on TRIP to 3.00 volts causes the level indicator signal to transition to a LOW logic level, turning-on device PCAPDIS and turning-off, device CAPDIS. When this occurs, the CAP node begins to charge at a first rate depending on the combined capacitance provided by devices PRES and NCAP as shown by portion (A1) in FIG. 4A. As the CAP node voltage increases, device PRES begins to turn-off which reduces the charging current of node CAP and thereby diminishing the slope of the CAP node charging curve, portion (A2).

The POR signal (E), FIG. 4D, is held HIGH while the CAP node is charging for about 4–5$\mu$ seconds. After the delay time the CAP node is charged to a voltage level that causes the Schmidt trigger inverter to trip and transition HIGH-to-LOW. Once the output of the Schmidt trigger transitions LOW, the CAP node is pulled to VDD by device PCAPUP in response to the feedback loop signal as described above. FIG. 4D also shows that the POR circuit works while ramping-up the power supply signal (i.e., Vps transitions LOW-to-HIGH) as well as when ramping down (i.e., Vps transitions HIGH-to-LOW). Specifically, when Vps transitions HIGH-to-LOW (at approximately 11$\mu$ seconds (FIGS. 4A–4E)) the POR signal briefly transitions LOW-to-HIGH then LOW again thus providing a reset signal when powering down the IC. This occurs because of DC operation of the level detector.

FIG. 4E shows signal (F) representing the power dissipation of the circuit as Vps is ramping, as the CAP node is charged, and as the POR output signal is generated. When Vps is LOW (e.g. Vps$\approx$VSS) the circuit shown in FIG. 3 is shut-down and does not dissipate power. This is shown by signal (F) between approximately 12–20$\mu$ seconds and 32–40$\mu$ seconds. In addition signal (F) shows that initially, power increases as the CAP node is charged. Once the POR output signal is provided, power dissipation drops to zero showing that the POR circuit dissipates no power once the POR signal transitions LOW.

FIGS. 5A–5E show timing diagrams of signals in the circuit embodiment shown in FIG. 3 in which the power supply signal is slowly ramped to VDD=3.00 volts. FIG. 5A shows the power supply signal (A) superimposed on the CAP node voltage signal (B). FIG. 5B shows the power supply signal (A) superimposed on the PDPATH voltage signal (C). FIG. 5C shows the power supply signal (A) superimposed on the TRIP signal (D). FIG. 5D shows the power supply signal (A) superimposed on the POR voltage signal (E). FIG. 5E shows a signal representing power dissipation of the circuit.

Referring to FIG. 5A, the time scale is now in seconds instead of microseconds as used in FIGS. 4A–4E and the power supply signal is slowly ramped towards VDD in approximately 3 seconds. When this occurs, ND2 and ND1 turn-on, causing PDPATH to slowly transition to a voltage corresponding to approximately two threshold voltages ($\approx$1.00 volt) above the reference potential as shown by (C) in FIG. 5B. With PDPATH at two threshold voltages above the reference potential, device PTRIP turns-on causing the voltage on the TRIP signal (D) to be pulled to a voltage level slightly less than the current voltage level of Vps, FIG. 5C. Pulling the voltage signal on TRIP to 3.00 volts causes the inverter to transition LOW, turning-on device PCAPDIS and turning-off, device CAPDIS. When this occurs, the CAP node charges at a rate of the combined capacitance provided by devices PRES and NCAP, however, since this occurs very quickly relative to the time frame shown in FIG. 5A, a charging curve of the CAP node is not discernable in the time frame of FIG. 5A.

Signal (E), FIG. 5D, shows the POR voltage signal transition from a current Vps voltage level to a logic LOW voltage level. This occurs once the CAP node is charged, causing the Schmidt trigger inverter to trip and transition HIGH-to-LOW. It should be noted that since the power supply is being ramped at such a slow rate, the delay time is not apparent prior to the POR signal transitioning LOW. Once the output of the Schmidt trigger transitions LOW causing the POR signal to transition LOW, the CAP node voltage level shown in FIG. 5A is pulled to the current voltage level of Vps by device PCAPUP in response to the feedback loop signal and follows it to VDD.

Notable features of the preferred embodiment of the POR circuit shown in FIG. 3 include:

a manual power down mode which can be externally applied so that the POR circuit does not dissipate power;

non-differential input voltage level detection circuit requiring no capacitively stored reference supply for comparing to the power supply signal;

use of a diode connected device coupled to the chargeable node so as to reduce charging current and add capacitance to the chargeable node and consequently reduce the size of the capacitive element device NCAP;

inclusion of a feedback loop for pulling the chargeable node to VDD for reducing noise injection which may cause the inverter to switch states.

In the preceding description, numerous specific details are set forth, such as voltages and device sizes and types in order to provide a thorough understanding of the present invention. It will be apparent, however, to one skilled in the art that these specific details need not be employed to practice the present invention. In other instances, well-known device and circuit theory and components have not been described in order to avoid unnecessarily obscuring the present invention.

Moreover, although the components of the present invention have been described in conjunction with certain embodiments, it is appreciated that the invention can be implemented in a variety of other ways. Consequently, it is to be understood that the particular embodiments shown and described by way of illustration is in no way intended to be considered limiting. Reference to the details of this embodiment is not intended to limit the scope of the claims which themselves recite only those features regarded as essential to the invention.

What is claimed is:

1. A circuit for generating a power-on-reset signals, said circuit having an associated power supply signal which is ramped to its full power, said circuit comprising:

a means for detecting when said power supply signal is at a first predetermined voltage level and outputting a level indicator signal indicating said first predetermined voltage level has been reached;

a means for charging a chargeable node to a second predetermined voltage level in a predetermined delay time in response to said level indicator signal, said charging means including a capacitive element and a diode connected MOS device coupled in series and coupled to said node for charging said node in said predetermined delay time;

a logic means responsive to said second predetermined voltage level and said level indicator signal for outputting said power-on-reset signal.

2. The circuit as described in claim 1 wherein said charging means includes a first and a second switching means such that when said level indicator signal is in a first state, said first switching means enables said means for charging said node and when said level indicator signal is in a second state, said second switching means enables a means for discharging said node to a reference potential.

3. The circuit as described in claim 1 wherein said logic means provides a feedback signal having an associated feedback loop so as to pull said chargeable node to a voltage level corresponding to a current power supply voltage level.

4. The circuit as described in claim 1 wherein said logic means includes an inverter and first and second logic gate means, said inverter having a trip point corresponding to said second predetermined voltage level, wherein when said chargeable node is charged to said second predetermined voltage level, said inverter outputs an intermediate power-on-reset signal, wherein said intermediate power-on-reset signal and said level indicator signal are each coupled to said first and second logic gate means such that when said chargeable node is charged to said second predetermined voltage level and said power supply signal has reached said first predetermined voltage level said logic means outputs said power-on-reset signal.

5. The circuit as described in claim 4 wherein said inverter is a Schmidt trigger inverter.

6. The circuit as described in claim 1 wherein said voltage detection means comprises a first stage coupled and responsive to said power supply signal wherein when said power supply signal is at a first voltage level, said first stage outputs an enable signal to a second stage;

said second stage coupled and responsive to said power supply signal and said enable signal wherein when said power supply signal is at a second voltage level said second stage outputs said level indicator signal.

7. The circuit as described in claim 6 wherein said first and second stages each comprises first and second MOS device stacks, respectfully, and said first and second voltage levels are proportional to MOS device threshold voltages.

8. The circuit as described in claim 6 further including a disable signal for disabling both of said first and second stages regardless of said power supply signal and such that said first and second stages do not dissipate power.

9. The circuit as described in claim 6 wherein said first stage comprises first, second, and third MOS devices coupled in series between said power supply signal and a reference potential, said first device having a first channel type and being coupled to a second device, said second device having a second channel type and having its gate coupled to said power supply signal, and said third device having said second channel type, being coupled to said second device and having its gate coupled to its drain, wherein said second and third devices being sized with respect to said first device such that when said power supply voltage reaches said first voltage level, said second and third devices overcome said first device so as to cause said first stage to enable said second stage.

10. The circuit as described in claim 9 wherein said second stage comprises fourth, fifth, and sixth MOS devices coupled in series between said power supply signal and said reference potential, said fourth device having said first channel type and being coupled to said fifth device, said fifth device having said first channel type and having its gate coupled to said enable signal, said sixth device having said second channel type, being coupled to said fifth device, and having its gate coupled to said power supply signal, wherein said fourth and fifth devices being sized with respect to said sixth device such that when said power supply voltage reaches said second voltage level, said fourth and fifth devices overcome said sixth device so as to cause said second stage to output said level indicator signal.

* * * * *